United States Patent
Saad et al.

(10) Patent No.: US 11,636,684 B2
(45) Date of Patent: Apr. 25, 2023

(54) BEHAVIOR MODEL OF AN ENVIRONMENT SENSOR

(71) Applicant: AVL LIST GMBH, Graz (AT)

(72) Inventors: Kmeid Saad, Otterfing (DE); Michael Paulweber, Hausmannstätten (AT)

(73) Assignee: AVL List GmbH, Graz (AT)

( * ) Notice: Subject to any disclaimer, the term of this patent is extended or adjusted under 35 U.S.C. 154(b) by 71 days.

(21) Appl. No.: 16/956,915

(22) PCT Filed: Dec. 20, 2018

(86) PCT No.: PCT/AT2018/060311
§ 371 (c)(1),
(2) Date: Nov. 9, 2020

(87) PCT Pub. No.: WO2019/119011
PCT Pub. Date: Jun. 27, 2019

(65) Prior Publication Data
US 2021/0056318 A1    Feb. 25, 2021

(30) Foreign Application Priority Data
Dec. 22, 2017   (AT) .............................. A 51070/2017

(51) Int. Cl.
*G06V 20/56*        (2022.01)
*G06F 30/20*        (2020.01)
(Continued)

(52) U.S. Cl.
CPC .............. *G06V 20/56* (2022.01); *G06F 30/15* (2020.01); *G06F 30/20* (2020.01); *G06N 3/0454* (2013.01); *G06N 3/08* (2013.01)

(58) Field of Classification Search
CPC ......... G06V 10/82; G06F 30/15; G06F 30/20; G06N 3/0454; G06N 3/08
See application file for complete search history.

(56) References Cited

U.S. PATENT DOCUMENTS 10,308,260 B2 *   6/2019   Fleck .................. B60W 50/045
10,592,805 B2 *   3/2020   Groh ....................... G06F 30/20
(Continued)

FOREIGN PATENT DOCUMENTS

EP        2950175        12/2015
JP        2010-26845     2/2010

OTHER PUBLICATIONS

Patra et al. "ANN-based intelligent pressure sensor in noisy environment," Measurement, 1998, vol. 23, No. 4, pp. 229-238.
(Continued)

*Primary Examiner* — Boubacar Abdou Tchoussou
(74) *Attorney, Agent, or Firm* — Sheridan Ross P.C.

(57) ABSTRACT

A computer-aided method for training an artificial neuronal network for the simulation of an environment sensor of a driver assistance system includes the following work steps: reading in traffic scenarios of a test journey; deriving test journey data and the sensor data to be output by the environment sensor from the traffic scenarios; generating a data stream which depicts the traffic scenarios from the perspective of the environment sensor; outputting the data stream such that the environment sensor can generate sensor data on the basis of the data stream and can provide same to
(Continued)

Figure 1:
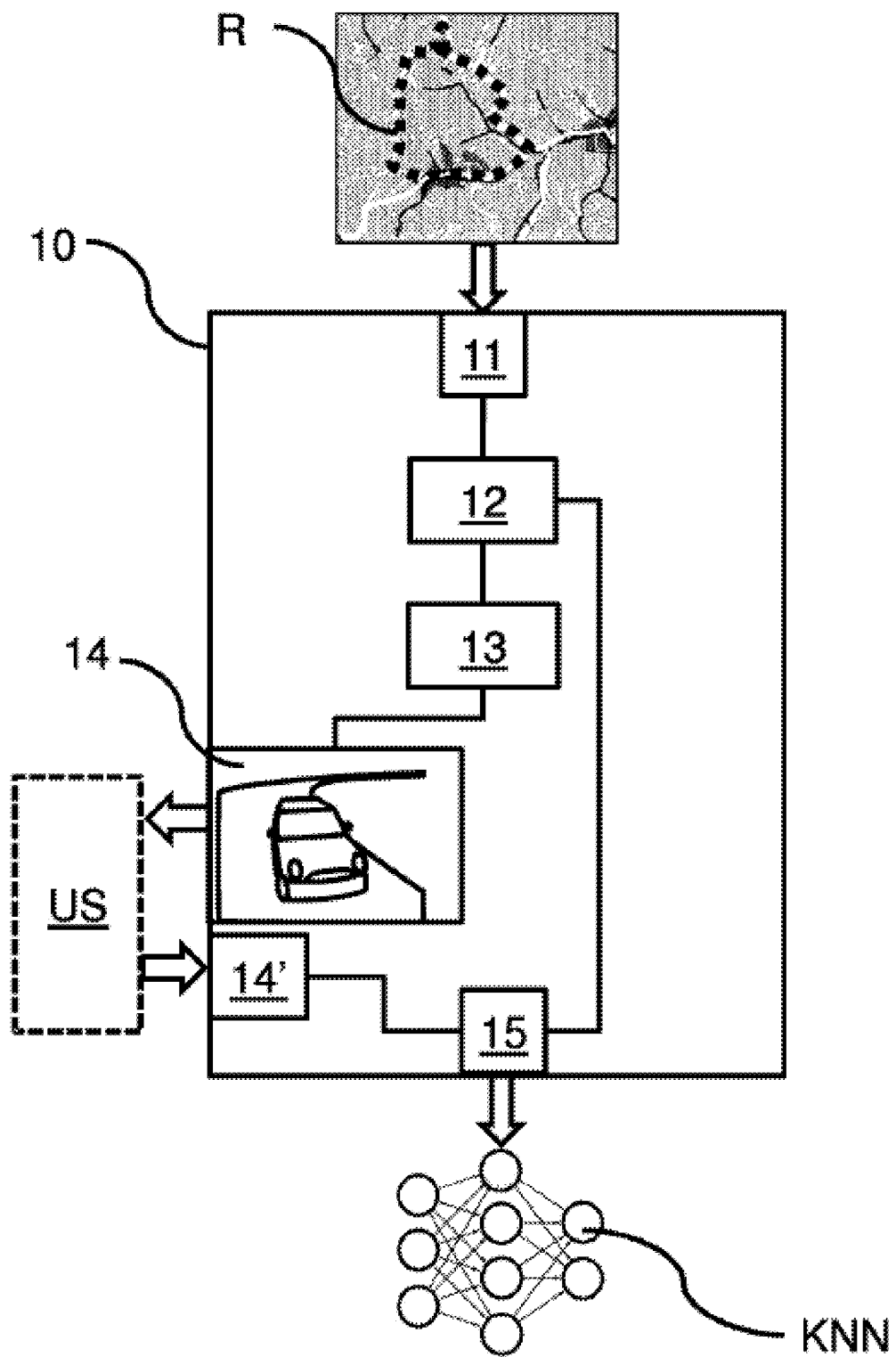

a data interface at which the test journey data and the sensor data to be output are also provided; and reading the provided data into the artificial neuronal network.

12 Claims, 5 Drawing Sheets

(51) Int. Cl.
  *G06F 30/15* (2020.01)
  *G06N 3/04* (2006.01)
  *G06N 3/08* (2006.01)

(56) References Cited

U.S. PATENT DOCUMENTS

| | | | | |
|---|---|---|---|---|
| 10,861,189 | B2* | 12/2020 | Potnis | G06N 3/0454 |
| 2009/0112334 | A1 | 4/2009 | Grichnik et al. | |
| 2010/0332422 | A1* | 12/2010 | Cheng | G06N 20/00 706/12 |
| 2017/0109644 | A1 | 4/2017 | Nariyambut Murali et al. | |
| 2017/0132334 | A1 | 5/2017 | Levinson et al. | |
| 2017/0364776 | A1 | 12/2017 | Micks et al. | |
| 2018/0025640 | A1* | 1/2018 | Micks | G08G 1/142 340/932.2 |
| 2018/0060725 | A1* | 3/2018 | Groh | G06N 3/08 |
| 2018/0079425 | A1* | 3/2018 | Fleck | B60W 50/045 |
| 2019/0197731 | A1* | 6/2019 | Potnis | H04N 7/183 |
| 2019/0228571 | A1* | 7/2019 | Atsmon | G01C 11/04 |
| 2021/0294326 | A1* | 9/2021 | Zheng | G06K 9/6289 |

OTHER PUBLICATIONS

Patra et al. "An ANN-based smart capacitive pressure sensor in dynamic environment," Sensors and Actuators A: Physical, 2000, vol. 86, Iss. 1-2, pp. 26-38.
Patra et al., "Auto-compensation of nonlinear influence of environmental parameters on the sensor characteristics using neural networks," ISA Transactions, 2005, vol. 44, No. 2, pp. 165-176.
Patra et al. "Artificial neural network-based nonlinearity estimation of pressure sensors," IEEE Transactions on Instrumentation and Measurement, Dec. 1994, vol. 43, No. 6, pp. 874-881.
Wang et al. "Shader-based Sensor Simulation for Autonomous Car Testing," 2012 15th International IEEE Conference on Intelligent Transportation Systems, Sep. 2012, pp. 224-229.
Official Action for Austria Patent Application No. A 51070/2017, dated Nov. 21, 2018, 6 pages.
Translation of the International Search Report for International (PCT) Patent Application No. PCT/AT2018/060311, dated Feb. 26, 2019, 2 pages.
International Preliminary Report on Patentability for International (PCT) Patent Application No. PCT/AT2018/060311, dated Nov. 28, 2019, 6 pages.
Official Action with English Translation for Japan Patent Application No. 2020-534437, dated Feb. 6, 2023, 16 pages.

* cited by examiner

BEHAVIOR MODEL OF AN ENVIRONMENT SENSOR

CROSS REFERENCE TO RELATED APPLICATIONS

This application is a national stage application under 35 U.S.C. 371 and claims the benefit of PCT Application No. PCT/AT2018/060311 having an international filing date of 20 Dec. 2018, which designated the United States, which PCT application claimed the benefit of Austria Patent Application No. A51070/2017 filed 22 Dec. 2017, the disclosures of each of which are incorporated herein by reference in their entireties.

The present invention relates to a method for training an artificial neuronal network for the simulation of an environment sensor of a driver assistance system. The invention furthermore relates to a method for analyzing such an environment sensor and a method for simulating such an environment sensor.

Due to the complexity of today's motor vehicles, there is a need to be able to collectively test their components at the earliest possible phase of development during the developmental process. Such tests of the interaction of different components can occur prior to a prototype being available either by simulated operation of the components on a test bench or even solely by an at least partially model-based simulation or a wholly model-based simulation. In such a model-based simulation, a model is used to simulate the operation of at least one component.

The components simulated on the basis of a model are generally modeled using a physical model. Quite a high level of abstraction is thereby required, particularly when the components are sensors which are to be depicted as virtual sensors within a model.

For some components, it is moreover difficult to obtain exact specifications. Particularly in the case of sensors, and in turn sensors which are part of or installed in driver assistance systems, vendors often do not provide the necessary data which would be needed for parameterization or even for forming a physical model. Preferably, such sensors, in particular environment sensors, comprise sensor hardware and a data processing device in which measurement signals are processed by means of a data processing algorithm, preferably for further processing for a driver assistance system.

Document US 2009/0112334 A1 relates to a method for a control system of a machine. The method may include generating a virtual sensor model characterizing inter-relationships between at least one parameter detected by the sensor and a plurality of measured parameters related to the machine.

It is a task of the invention to provide a method able to improve the simulation of an environment sensor of a driver assistance system. In particular a task of the invention is that of being able to simulate the operation of a sensor so precisely that the data output by the simulation model is suitable for virtual road tests for testing a virtual or real driver assistance system.

This task is solved by a method for training an artificial neuronal network in accordance with claim 1, a method 5 for analyzing an environment sensor in accordance with claim 2, and a method for simulating an environment sensor in accordance with claim 4 as well as by an apparatus for training an artificial neuronal network in accordance with claim 10, an apparatus for analyzing an environment sensor of a driver assistance system in accordance with claim 11, and an apparatus for simulating an environment sensor of a 10 driver assistance system according to claim 12. Advantageous embodiments are claimed in the subclaims. The teaching of the claims is expressly made a part of the description. For purposes of the present disclosure, it should be understood that the terms "sensor data to be output" and "ground truth sensor data" are equivalent.

A first aspect of the invention relates to a method for training an artificial neuronal network for simulating an environment sensor of a driver assistance system which preferably comprises the following procedural steps:
importing traffic scenarios of a road test;
deriving road test data and the sensor data to be output by the environment sensor from the traffic scenarios;
generating a data stream, in particular an image stream, which maps the traffic scenarios from the perspective of the environment sensor;
outputting the data stream such that the environment sensor can generate sensor data on the basis of the data stream and can provide it at a data interface at which the road test data and the sensor data to be output are also provided; and
importing the provided data into the artificial neuronal network.

A second aspect of the invention relates to a corresponding system for training an artificial neuronal network for simulating an environment sensor of a driver assistance system which preferably comprises:
an interface for importing traffic scenarios of a road test;
means for deriving road test data and the sensor data to be output by the environment sensor from the traffic scenarios;
means, in particular a graphics card, for generating a data stream, in particular an image stream, which maps the traffic scenarios from the perspective of the environment sensor;
an interface, in particular a display, for outputting the data stream such that the environment sensor can generate sensor data on the basis of the data stream; and
a data interface at which the generated sensor data, the road test data and the sensor data to be output can be provided to the artificial neuronal network.

A third aspect of the invention relates to a method for analyzing an environment sensor of a driver assistance system which preferably comprises the following procedural steps:
importing traffic scenarios from a plurality of road tests;
deriving road test data and the sensor data to be output by the environment sensor from the traffic scenarios;
generating a data stream, in particular an image stream, which maps the traffic scenarios from the perspective of the environment sensor;
outputting the data stream to the environment sensor which generates sensor data on the basis of the data stream;
performing a curve fitting via an artificial neuronal network on the basis of the road test data, the sensor data to be output and the sensor data generated by the environment sensor; and
applying a simulation model based on the curve fitting, wherein the simulation model is configured to simulate and output sensor data on the basis of a data stream from a road test.

A fourth aspect of the invention relates to a corresponding system for analyzing an environment sensor of a driver assistance system which preferably comprises:
an interface for importing traffic scenarios from a plurality of road tests;
means for deriving road test data and the sensor data to be output by the environment sensor from the traffic scenarios;

means, in particular a graphics card, for generating a data stream, in particular an image stream, which maps the traffic scenarios from the perspective of the environment sensor;
an interface, in particular a display, for outputting the data stream to the environment sensor which generates sensor data on the basis of the data stream;
means for performing a curve fitting via an artificial neuronal network on the basis of the road test simulation data, the sensor data to be output and the sensor data generated by the environment sensor;
means for determining sensor data using a simulation model based on the curve fitting, wherein the simulation model is configured to simulate sensor data on the basis of a data stream, in particular an image stream, of any given road test; and
a data interface for outputting the sensor data determined via the simulation model.

A fifth aspect of the invention relates to a method for simulating an environment sensor of a driver assistance system which preferably comprises the following procedural steps:
capturing a data stream which maps a road test from the perspective of the environment sensor;
determining sensor data using a simulation model configured to simulate sensor data on the basis of a data stream of the road test, wherein the simulation model is based on curve fitting via an artificial neuronal network on the basis of the road test data and data streams from a plurality of different road tests as well as sensor data generated by the environment sensor during said road tests; and
outputting the sensor data determined via the simulation model.

A sixth aspect of the invention relates to a corresponding system for simulating an environment sensor of a driver assistance system which preferably comprises:
an interface, in particular a camera, for capturing a data stream which maps a road test from the perspective of the environment sensor;
means for determining sensor data using a simulation model configured to simulate sensor data on the basis of a data stream of any given road test, wherein the simulation model is based on curve fitting via an artificial neuronal network on the basis of the road test data and data streams from a plurality of different road tests as well as sensor data generated by the environment sensor during said road tests (R); and
a data interface for outputting the sensor data determined via the simulation model.

In the sense of the invention, an environment sensor is preferably configured to capture information about an environment of a vehicle which incorporates the driver assistance system. Preferably, this information relates to at least one property from the following group of properties: temperature, images, in particular optical, infrared or radar images, distances, humidity, air pressure, dynamic pressure, electromagnetic radiation, radioactive radiation, brightness, visibility.

The environment sensor is thereby preferably designed as hardware and/or software. Preferably, the environment sensor has a data processing algorithm. Alternatively or additionally, the environment sensor has an apparatus for capturing the information.

Road test data in the sense of the invention is preferably environmental data relating to the vehicle incorporating the driver assistance system. The environmental data is thereby those properties of the environment which are preferably not captured by the environment sensor to be simulated. Alternatively or additionally, the road test data includes static data comprising the dimensions as well as the properties of the vehicle, although in particular also the dimension of the road. Additionally or alternatively, the road test data comprises so-called ego data which includes the dynamic properties of the vehicle incorporating the driver assistance system such as, for example, flashing light signals, speed, acceleration and/or tilting, yawing or rolling motion.

A data stream in the sense of the invention preferably contains information. Further preferably, a data stream is an optical signal, an electromagnetic signal, a humidity value, an air pressure value, a dynamic pressure value, a radiation value, a temperature value or a brightness value. Preferably, the data stream relates to a sequence of values of the information as a function of time and/or traveled distance.

A data interface in the sense of the invention is preferably part of an artificial neuronal network or an apparatus and/or a computer program which in each case realizes the method according to the invention. The data interface can thereby preferably comprises multiple sub-interfaces, each of which is formed by hardware and/or software.

A means in the sense of the invention is preferably designed in terms of hardware and/or software technology, in particular a preferably digital processor, particularly a microprocessor unit (CPU) preferably data-connected or signal-connected to a memory and/or bus system and/or comprising one or more programs or program modules. The CPU can be designed to process commands executed as a program stored in a memory system, to capture input signals from a data bus and/or to output signals to a data bus. A storage system can comprise one or more, in particular different, storage media, in particular optical, magnetic, solid-state and/or other non-volatile media. The program can be structured so as to embody or respectively be capable of executing the methods described here such that the CPU can execute the steps of such methods and thus can in particular determine a value of a target variable in relation to the robustness of at least one vehicle of a vehicle type.

A traffic scenario in the sense of the invention is preferably a constellation of road users and objects in the area and surroundings of a roadway, in particular a road. Further preferably, a traffic scenario comprises one or more consecutive traffic sequences.

The invention is based in particular on the approach of emulating the sensors of a driver assistance system using so-called behavioral models. Such behavioral models are generally based on methods of deep learning.

By means of a simulation model based on a behavioral model, it is in particular possible to model a sensor without knowing its exact specifications. This applies both to the specifications as regards any hardware components of the sensor as well as to any existing data processing algorithm which is preferably part of the environment sensor, in particular a data processing device of the environment sensor. In order to obtain particularly precise simulation results for the sensor, the simulation model is trained using data streams which reflect the respective road test from the point of view or perspective of the respective environment sensor. Furthermore, the model is provided with test data and with the sensor data to actually be output by the sensor.

The sensor data to be output by the environment sensor to be simulated is likewise obtained from the traffic scenarios of the respective road test. In a simulated/virtual road test, the simulation environment can already provide this data; in traffic scenarios based on a real road test, evaluation algorithms or even manual human evaluation can be used.

The artificial neural network can be constructed little by little by importing the input variables (road test data, output sensor data) and the output variables to be output (sensor data to be output).

The inventive approach is in particular characterized in that the sensor model can be trained with realistic data related to the respective positional location of the environment sensor.

The simulation model based on artificial neural networks moreover has the advantage of being able to reproduce the actual behavior of a real sensor in real time. Road tests for the driver assistance system can thus be performed in real time on the basis of the data from the simulated environment sensor.

The simulation model based on artificial neural networks moreover has the advantage of being able to realistically simulate the behavior of, or respectively a change in the output of, the environment sensor to be simulated for the same traffic scenario amidst disturbances such as different environmental conditions, in particular weather conditions and/or defects in the hardware of the environment sensor (US), e.g. a lens aberration or even a lens being fogged with moisture or being dirty. If a sensor generates for example an object list, the object list can deviate substantially upon occurrence of such disturbances from an object list which would be generated without the occurrence of said disturbances. The behavior is similar with changes in parameters which are relevant to how the environment sensor to be simulated perceives traffic scenarios but which the environment sensor to be simulated does not itself capture.

This is inventively achieved by training the simulation model using the sensor data to be output at a specific point in time (also known as "ground truth sensor data"), i.e., the environment sensor's ideal perception of the driving scenarios; the sensor data output at that specific point in time, i.e., the environment sensor's actual perception of the driving scenarios and the road test data.

A seventh aspect of the invention relates to a method for analyzing a driver assistance system, wherein during a real or simulated road test, the driver assistance system is fed the sensor data output using a method according to the first, third or fifth aspect of the invention as well as data from other virtual or real sensors preferably available within a data network, in particular an identification network, of a vehicle. This method enables testing the performance of the overall system comprising the driver assistance system and the simulated environment sensor and any further sensors as applicable. The data of the simulated sensor as well as further simulated or real sensors can be consolidated in particular by means of sensor fusion.

In one advantageous embodiment of the method according to the first and third aspect of the invention, the procedural steps are repeated with different road tests until the artificial neuronal network maps the function of the sensor as accurately as possible, in particular until the data to be output is 95% consistent, preferably 98% consistent, with the data output related to a road test not incorporated into the curve fitting.

One advantageous embodiment of the method according to the fifth aspect of the invention furthermore comprises the following procedural step:
generating a data stream, in particular an image stream, which maps a road test from the perspective of the environment sensor, in particular on the basis of the traffic scenarios.

Accordingly, in one advantageous embodiment, the apparatus for simulating an environment sensor according to the sixth aspect of the invention comprises means for generating a data stream, in particular an image stream, which maps a road test from the perspective of the environment sensor, in particular on the basis of traffic scenarios from the road test.

In one advantageous embodiment, the method according to one of the aspects of the invention furthermore comprises the following procedural step:
deteriorating, in particular distorting, the data stream, in particular the image stream, wherein preferably weather conditions and/or defects in the hardware of the environment sensor are taken into account. This advantageous embodiment enables checking the ability of a data processing algorithm of the sensor or even of a driver assistance system itself to handle faulty sensor data or to compensate for same during operation.

In a further advantageous embodiment of the method according to one of the aspects of the invention, the road test or road tests is/are simulated on a test bench or on the basis of a model or run as actual road tests, preferably using a combination of the above-mentioned possibilities. In so doing, the environment sensor or the driver assistance system respectively can be tested in each phase of a development cycle.

Further advantages and features will become apparent from the preferential exemplary examples described below with reference to the figures.

Figure 2:
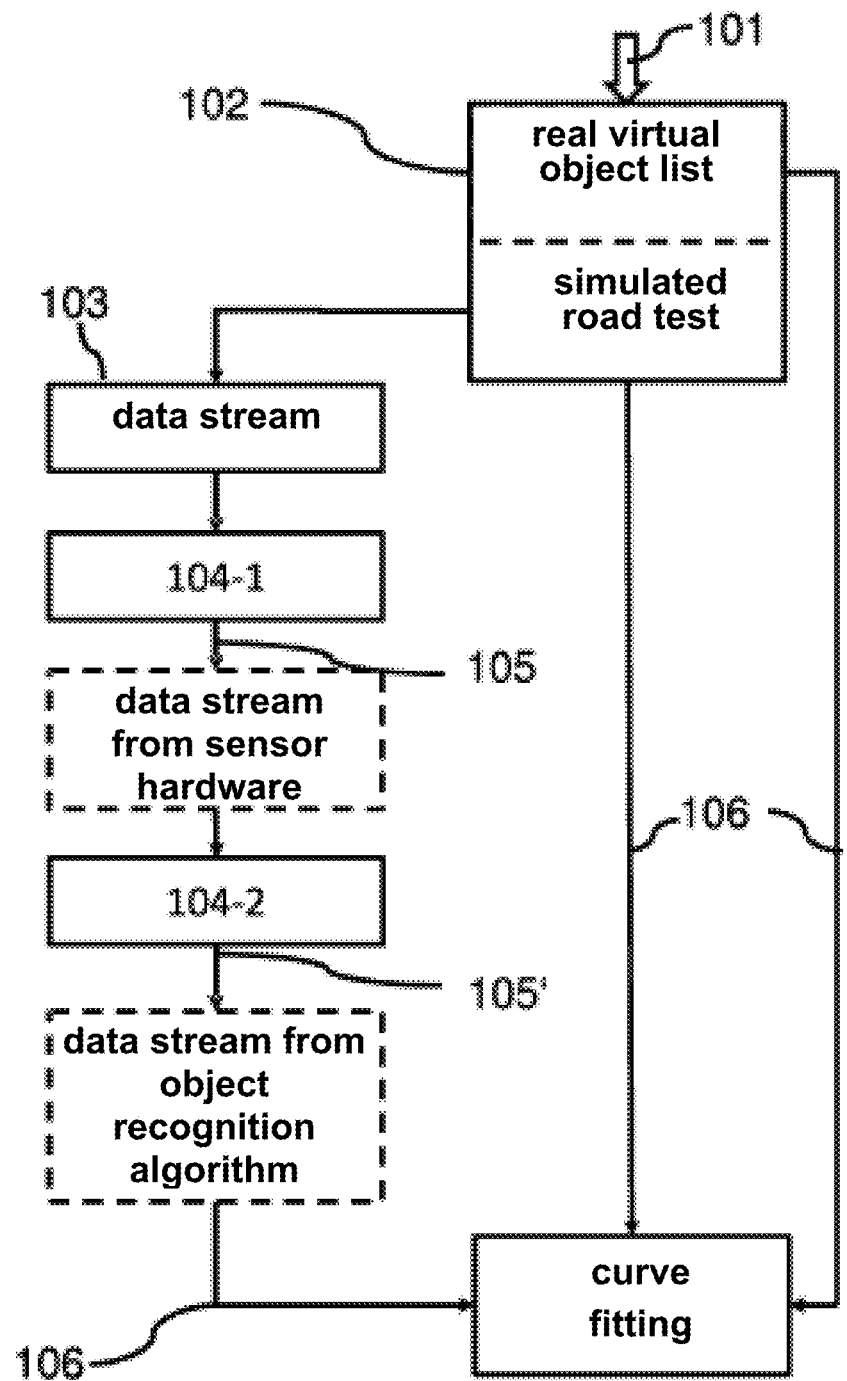
Figure 3:
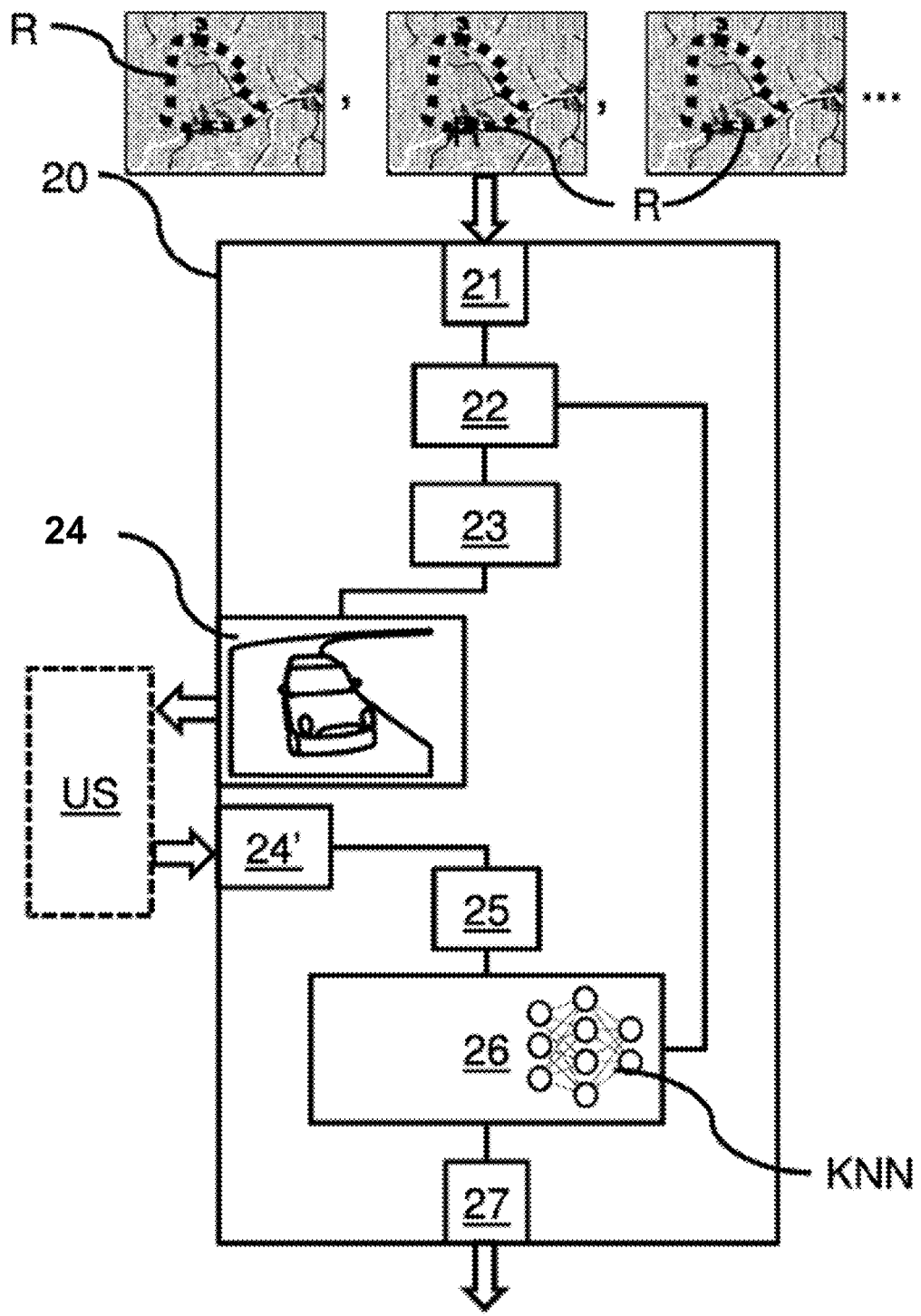
Figure 4:
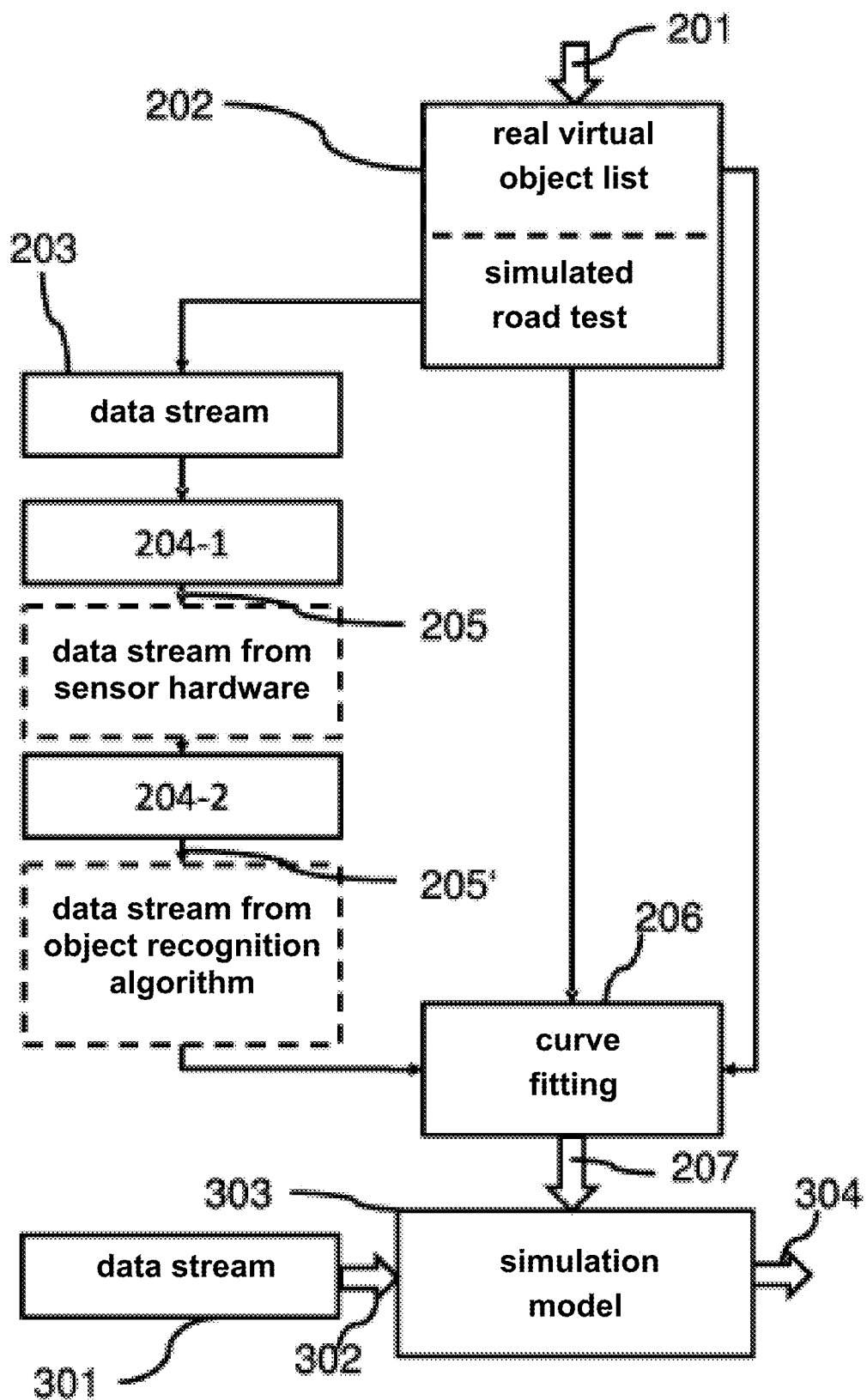
Figure 5:
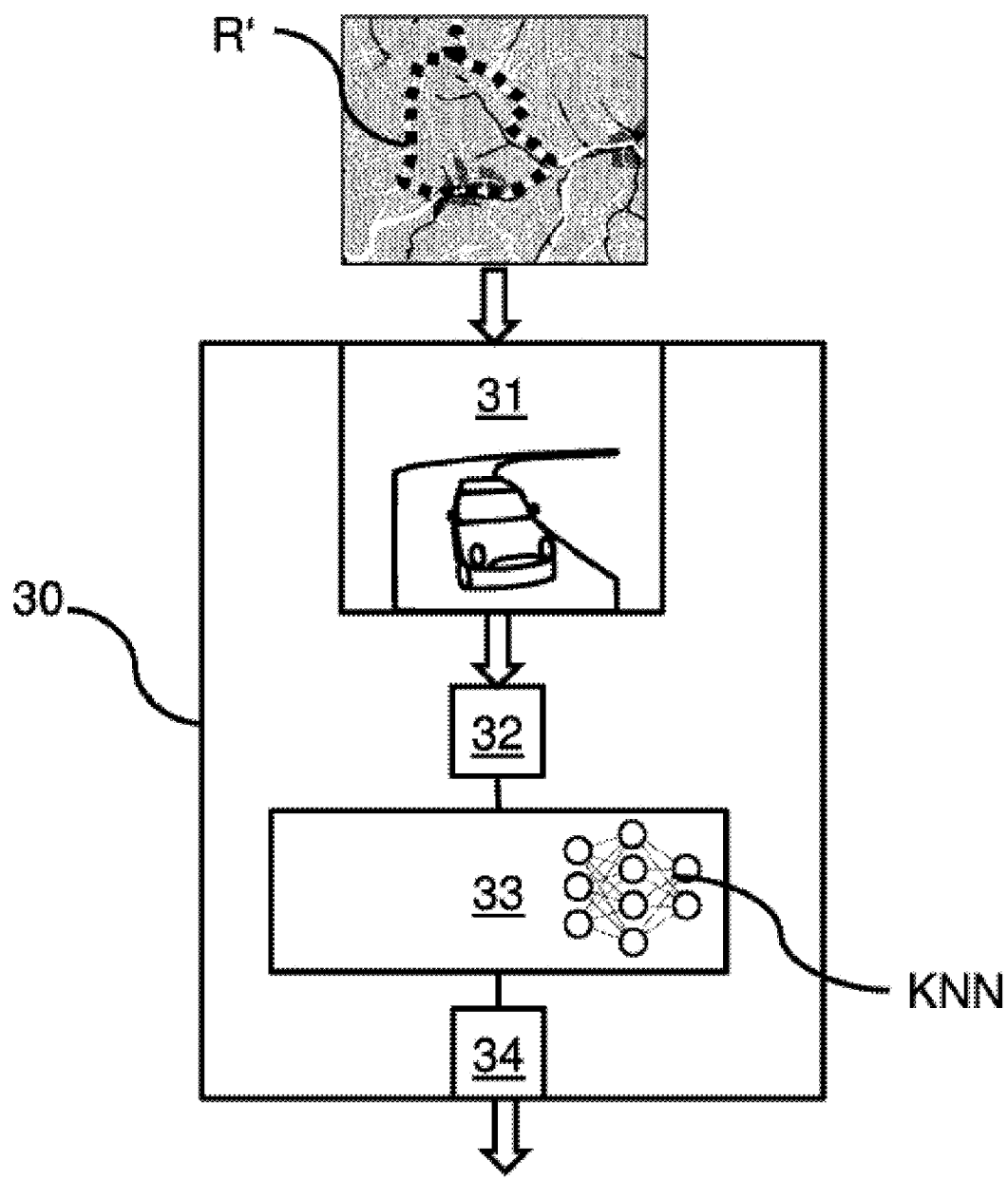

Shown therein at least partially schematically:

FIG. 1 one exemplary embodiment of an apparatus according to the second aspect of the invention;

FIG. 2 one exemplary embodiment of a method according to the first aspect of the invention;

FIG. 3 one exemplary embodiment of an apparatus according to the third aspect of the invention;

FIG. 4 one exemplary embodiment of the method according to the third aspect of the invention and one exemplary embodiment of the method according to the fifth aspect of the invention; and FIG. 5 one exemplary embodiment of the apparatus according to the sixth aspect of the invention.

FIG. 1 shows a first exemplary embodiment of an inventive apparatus for training an artificial neuronal network KNN for simulating an environment sensor US of a driver assistance system.

For all the exemplary embodiments, the invention is described in the following on the basis of an optical camera as the environment sensor US. In principle, however, other components, in particular other (environment) sensors, can also be simulated and analyzed using the described methods and systems. In this regard, these for example include, but are not limited to, lidar sensors, radar sensors, ultrasonic sensors, temperature sensors, humidity sensors, radiation sensors, etc.

The corresponding method 100 able to be realized with system 10 is depicted in FIG. 2.

Data from a road test R, or the traffic scenarios encountered on the road test R respectively, are provided to the system 10, respectively imported 101 by the system 10. The road test can be a simulated road test R, or simulated traffic scenarios respectively, generated for example using the CarMaker® software from IPG Automotive®. Alternatively, the road test R, its traffic scenarios respectively, can however also be recorded during actual operation of a vehicle.

Road test data as well as the actual "real" sensor data to be recognized and output by the environment sensor US is extracted or derived 102 from the traffic scenarios of the road test R via means 11. For purposes of the present disclosure, it should be understood that the terms "sensor data to be output" and "ground truth sensor data" are equivalent. If the traffic scenarios are provided by simulation software such as CarMaker®, extraction substantially comprises identifying that road test data which is essential to the system 10 or method 100 and that data which is relevant to the environment sensor to be simulated.

As regards an optical camera, this could for example be an object list to be generated. A "real" object list can be derived 102 directly from simulation software such as CarMaker®. In the case of recorded traffic scenarios of actual road tests, the number of objects generally needs to be determined by means of a so-called labeling tool. This can ensue automatically, although as a general rule, a person needs to verify whether the data is correct.

The road test data which is in turn derived 102 from the traffic scenarios is e.g. environmental data, thus in particular data from other sensors such as that of the environment sensor US to be analyzed, static data, in particular the dimension of the vehicle as well as the road, and ego data, particularly dynamic data of the vehicle as well as other vehicle status data such as, for example, signaling or even turning on high-beams. The derivation can thereby be realized via the derivation means 12.

A data stream, in particular an image stream, which maps the traffic scenarios from the perspective of the environment sensor US is likewise generated 103 on the basis of the traffic scenarios of the road test R via means 13.

In the case of the image stream, preferably a commercially available graphics card 13, or specific graphics software for such a graphics card respectively, can thereby be used as means 13.

The image stream thus generated is output 105 on a display 14 as an interface to the camera US.

Prior to the output, there is the optional possibility of degrading the image stream 104-1, in particular simulating weather conditions. Doing so can obtain or check a reaction of the environment sensor US or respectively the quality of the sensor data determined by the environment sensor US under these circumstances.

In one alternative embodiment, the data stream which maps the traffic scenarios from the perspective of the environment sensor US is output directly to a model of the physical part of the sensor, thus a model of the sensor hardware. In the case of an optical camera, the model of the sensor hardware, i.e. the camera hardware, substantially depicts an optical system and an image sensor.

Alternatively or additionally, it is also possible to degrade 104-2, 204-2 a data stream from the camera hardware or from the camera hardware model prior to the processing by a data processing algorithm of the environment sensor US, in the present example an object recognition algorithm of the camera, and only then output it 105', 205' to the object recognition algorithm. Potential degrading of the image stream or data stream able to be induced or respectively simulated by the camera hardware or the model of the camera hardware are e.g. optical system imaging errors or image sensor defects or fouling.

On the basis of the output image stream or degraded image stream, respectively the data stream output from the sensor hardware or the sensor hardware model, the object recognition algorithm generates sensor data which is re-imported back into the system 10 via a further interface 14' and provided together with the derived road test data and the actual sensor data to be output via a further data interface 15.

This data; i.e. the sensor data, the derived road test data and the actual sensor data to be output can then be imported 106 into the artificial neuronal network KNN for training it.

Preferably, these procedural steps are repeated with different road tests and thus different traffic scenarios for training the artificial neuronal network KNN up until the artificial neuronal network KNN maps the function of the environment sensor US as accurately as possible.

Accuracy can for example be determined by confronting the trained artificial neuronal network KNN with data which is not used in the training of unknown road tests R' and comparing the sensor data actually to be output with the sensor data generated by the artificial neuronal network KNN on the basis of said data. Preferably, the sensor data to be output and the sensor data generated via the artificial neuronal network KNN should match with an accuracy of at least 95%, preferably more than 98% accuracy, before method 100 is terminated.

A curve fitting is realized via the artificial neuronal network KNN, the result being a simulation model of the environment sensor US. Depending on whether the sensor hardware, thus the camera hardware in the present exemplary embodiment, was thereby used for training the artificial neuronal network KNN or the sensor hardware was simulated by a model, the artificial neuronal network KNN depicts the entire environment sensor US or just one data processing algorithm of the environment sensor US, in particular an object recognition algorithm of the camera without the sensor hardware.

Reference is made to FIGS. 3 and 4 in explaining a system 20 and a method 200 able to be realized by means of the system 20 which serve in analyzing an environment sensor US of a driver assistance system according to the invention.

FIGS. 3 and 4 relate in particular to the method of the third aspect of the invention and the corresponding system according to the fourth aspect of the invention.

The procedure substantially corresponds to that as was described with reference to FIGS. 1 and 2 for the first and second aspects of the invention.

Traffic scenarios from a plurality of road tests are imported 201 into the system for analyzing the environment sensor US of a driver assistance system via an interface 21. Road test data and sensor data to be output by the environment sensor US are derived 202 from the traffic scenarios via derivation means 22.

A graphics card 23 generates an image stream which maps the road tests from the perspective of the environment sensor US on the basis of the traffic scenarios. The image stream is output via an interface 24, 24', in particular a display, to the environment sensor US which generates sensor data 205; 205' based on the data stream.

It is also possible in an alternative embodiment of method 200 to output the data stream mapping the traffic scenarios from the perspective of the environment sensor US directly to a model of the physical part of the sensor, thus a model of the sensor hardware. In the case of an optical camera US, the model of the sensor hardware; i.e. the camera hardware, substantially depicts an optical system and an image sensor.

It is also possible for the image stream or data stream to be degraded in method 200, either by simulated environmental conditions 204-1 prior to the image stream or data stream being captured by the camera hardware, or respectively a model of the camera hardware, or by simulated errors of the camera hardware or the model of the camera hardware itself 204-2 prior to the image/data stream being furnished to an object recognition algorithm.

Lastly, all the data; i.e. the sensor data, the derived road test data and the actual sensor data to be output, is fed to a curve fitting based in particular on an artificial neuronal network KNN, whereby the curve fitting is preferably realized 206 via appropriate data processing means 25. The artificial neuronal network KNN can preferably be trained in this way.

In contrast to system 10, system 20 now also comprises means 26 for determining sensor data using a simulation model. When this simulation model, which preferably incorporates the trained artificial neuronal network KNN, is applied 207, sensor data of the environment sensor can thus be simulated on the basis of a data stream from any given road test R'. This simulated sensor data can lastly be output via a data interface 27. Also in this exemplary embodiment, the simulation model maps the entire sensor or even just a data processing algorithm, in particular an object recognition algorithm, without the sensor hardware depending on whether the sensor hardware, thus in the present exemplary embodiment, the camera hardware, was used to generate the sensor data or was thereby simulated by a model of the sensor hardware.

A method for simulating an environment sensor of a driver assistance system according to the fifth aspect of the invention and a corresponding system 30 according to the sixth aspect of the invention are lastly described also on the basis of FIG. 4 and FIG. 5.

As shown in FIG. 5, the system 30 comprises means 31 for generating an image stream or data stream which maps road tests 301 from the perspective of the environment sensor US.

This image stream or data stream is captured 302 preferably by means of a camera or a data interface 32. The information of the captured image stream or data stream is fed to a simulation model.

The simulation model simulates sensor data on the basis of the captured image stream or data stream via data processing means 33, wherein the simulation model is preferably based on curve fitting via an artificial neuronal network KNN on the basis of road test data and data streams from a plurality of different road tests as well as sensor data generated from these road tests by the environment sensor US or simply by the data processing algorithm of the environment sensor US 303.

The simulation model preferably corresponds in each case to one of the different simulation models able to be generated via the methods of the first and third aspects of the invention.

The sensor data determined by means of the simulation model is ultimately output 304 via a data interface 34.

The sensor data simulated by means of a simulation model according to the invention is particularly suited to so-called sensor fusion for testing a driver assistance system or even a vehicle.

The simulated sensor data of the environment sensor US is thereby merged with further sensor data of further simulated environment sensors or even actual outputs of real sensors so as to be able to test the driver assistance system or vehicle respectively under as realistic conditions as possible in different stages of development.

It is pointed out that the exemplary embodiments are merely examples which are in no way to be limiting of protective scope, application and configuration. Rather, the preceding description affords one skilled in the art a guideline for the implementation of at least one exemplary embodiment, whereby various modifications can be made, in particular with regard to the function and arrangement of the described components, without departing from the protective scope as results from the claims and equivalent combinations of features.

What is claimed is:

1. A computer-aided method for training an artificial neuronal network for simulating the behavior of an environment sensor of a driver assistance system in traffic scenarios, comprising:
    importing the traffic scenarios of a road test;
    deriving road test data from the traffic scenarios;
    providing the road test data to a data interface;
    deriving ground truth sensor data for the environment sensor from the traffic scenarios;
    providing the ground truth sensor data to the data interface;
    generating a data stream, which maps the traffic scenarios from a perspective of the environment sensor;
    outputting the data stream to the environment sensor such that the environment sensor can generate sensor data on the basis of the data stream and the environment sensor can provide the generated sensor data to the data interface; and
    importing the generated sensor data, the road test data, and the ground truth sensor data into the artificial neuronal network.

2. A computer-aided method for analyzing an environment sensor of a driver assistance system, comprising:
    importing traffic scenarios from a plurality of road tests;
    deriving road test data from the traffic scenarios;
    deriving ground truth sensor data for the environment sensor from the traffic scenarios;
    generating a data stream, which maps the traffic scenarios from a perspective of the environment sensor;
    outputting the data stream to the environment sensor which generates sensor data on the basis of the data stream;
    performing a curve fitting via an artificial neuronal network on the basis of the road test data, the ground truth sensor data, and the sensor data generated by the environment sensor; and
    applying a simulation model based on the curve fitting, wherein the simulation model is configured to simulate and output sensor data on the basis of a data stream from any given road test.

3. The method according to claim 1, wherein the procedural steps are repeated with different road tests until the artificial neuronal network maps the function of the environment sensor as accurately as possible with the sensor data output related to a road test not incorporated into the curve fitting.

4. A computer-aided method for simulating the behavior of an environment sensor of a driver assistance system in traffic scenarios, comprising:
    deriving ground truth sensor data for the environment sensor from the traffic scenarios;
    capturing a data stream, which maps a road test from a perspective of the environment sensor;
    determining sensor data using a simulation model of the environment sensor based on the captured data, wherein the simulation model is configured to simulate the sensor data on the basis of a data stream of any given road test, and wherein the simulation model is based on a curve fitting via an artificial neuronal network on the basis of road test data, data streams from a plurality of different road tests, the ground truth sensor data, and the sensor data generated by the environment sensor during said road tests; and
    outputting the sensor data determined via the simulation model.

5. The method according to claim 2, wherein the sensor data is furthermore simulated on the basis of road test data of the road test used for the simulation.

6. The method according to claim 4, further comprising: generating the data stream, which maps the road test from the perspective of the environment sensor.

7. A computer-aided method for analyzing a driver assistance system, wherein during a real or simulated road test, the driver assistance system is fed the sensor data output using the method of claim 2 as well as data from other virtual or real sensors available within a data network of a vehicle.

8. A method according to claim 1, further comprising: deteriorating the data stream, wherein weather conditions and/or defects in the hardware of the environment sensor are taken into account.

9. The method according to claim 1, wherein the road test or road tests is/are simulated on a test bench, simulated on the basis of a model, and/or run as actual road tests.

10. A system for training an artificial neuronal network for simulating an environment sensor of a driver assistance system, comprising:
an interface for importing traffic scenarios of a road test;
means for deriving road test data from the traffic scenarios;
means for deriving ground truth sensor data for the environment sensor from the traffic scenarios;
means for generating a data stream, which maps the traffic scenarios from a perspective of the environment sensor;
an interface for outputting the data stream such that the environment sensor can generate sensor data on the basis of the data stream; and
a data interface at which the generated sensor data, the road test data, and the ground truth sensor data can be provided to the artificial neuronal network.

11. A system for analyzing an environment sensor of a driver assistance system, comprising:
an interface for importing traffic scenarios from a plurality of road tests;
means for deriving road test data from the traffic scenarios;
means for deriving ground truth sensor data for the environment sensor from the traffic scenarios;
means for generating a data stream, which maps the traffic scenarios from a perspective of the environment sensor;
an interface for outputting the data stream to the environment sensor which generates sensor data on the basis of the data stream;
means for performing a curve fitting via an artificial neuronal network on the basis of the road test data, the ground truth sensor data, and the sensor data generated by the environment sensor;
means for determining sensor data using a simulation model based on the curve fitting, wherein the simulation model is configured to simulate sensor data on the basis of a data stream of any given road test; and
a data interface for outputting the sensor data determined via the simulation model.

12. A system for simulating an environment sensor of a driver assistance system, comprising:
means for deriving ground truth sensor data for the environment sensor from traffic scenarios;
an interface for capturing a data stream which maps a road test from a perspective of the environment sensor;
means for determining sensor data using a simulation model configured to simulate sensor data on the basis of a data stream of any given road test, wherein the simulation model is based on a curve fitting via an artificial neuronal network on the basis of road test data, data streams from a plurality of different road tests, the ground truth sensor data, and sensor data generated by the environment sensor during said road tests; and
a data interface for outputting the sensor data determined via the simulation model.

* * * * *